US009028922B2

(12) United States Patent
Yagi et al.

(10) Patent No.: US 9,028,922 B2
(45) Date of Patent: May 12, 2015

(54) DEPOSITION QUANTITY MEASURING APPARATUS, DEPOSITION QUANTITY MEASURING METHOD, AND METHOD FOR MANUFACTURING ELECTRODE FOR ELECTROCHEMICAL ELEMENT

(75) Inventors: Hiromasa Yagi, Osaka (JP); Kazuyoshi Honda, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 703 days.

(21) Appl. No.: 13/384,928

(22) PCT Filed: Jul. 2, 2010

(86) PCT No.: PCT/JP2010/004365
§ 371 (c)(1),
(2), (4) Date: Jan. 19, 2012

(87) PCT Pub. No.: WO2011/010430
PCT Pub. Date: Jan. 27, 2011

(65) Prior Publication Data
US 2012/0121794 A1    May 17, 2012

(30) Foreign Application Priority Data

Jul. 24, 2009   (JP) .................................. 2009-172708

(51) Int. Cl.
*H01M 4/13*    (2010.01)
*H01G 11/22*    (2013.01)
(Continued)

(52) U.S. Cl.
CPC .............. *H01M 4/139* (2013.01); *H01G 11/22* (2013.01); *H01G 11/50* (2013.01); *H01G 11/86* (2013.01);
(Continued)

(58) Field of Classification Search
CPC ............ C23C 16/52; B05D 5/12; H01J 37/26
USPC .................................................. 250/308, 310
See application file for complete search history.

(56) References Cited

U.S. PATENT DOCUMENTS 3,405,267 A * 10/1968 Chope ........................... 250/308
3,665,199 A *  5/1972 Cahill et al. .................. 250/308
(Continued)

FOREIGN PATENT DOCUMENTS

JP           54-4828         1/1979
JP           01-173810       7/1989
(Continued)

OTHER PUBLICATIONS

International Search Report issued in International Patent Application No. PCT/JP2010/004365 dated Sep. 7, 2010.

*Primary Examiner* — Casey Bryant
(74) *Attorney, Agent, or Firm* — McDermott Will & Emery LLP

(57) ABSTRACT

A manufacturing method according to the present invention includes a step of allowing lithium to deposit on a substrate provided with a layer capable of forming a compound together with lithium. A first beta ray and a second beta ray are emitted toward the substrate for irradiation before the deposition step to measure backscattering, from the substrate, of the first beta ray and the second beta ray. The first beta ray and the second beta ray are emitted toward the substrate for irradiation after the deposition step to measure backscattering, from the substrate, of the first beta ray and the second beta ray. A decrement in backscattering of the first beta ray before and after lithium deposition and a decrement in backscattering of the second beta ray before and after lithium deposition are calculated. The deposition step is controlled depending on the decrement in the backscattering of the first beta ray and the decrement in the backscattering of the second beta ray.

13 Claims, 5 Drawing Sheets

(51) Int. Cl.
*H01M 4/139* (2010.01)
*H01G 11/50* (2013.01)
*H01G 11/86* (2013.01)
*H01M 4/04* (2006.01)
*C23C 14/14* (2006.01)
*C23C 14/54* (2006.01)
*C23C 14/56* (2006.01)

(52) U.S. Cl.
CPC ............... *Y02E 60/122* (2013.01); *Y02E 60/13* (2013.01); *H01M 4/0423* (2013.01); *C23C 14/14* (2013.01); *C23C 14/545* (2013.01); *C23C 14/562* (2013.01)

(56) References Cited

U.S. PATENT DOCUMENTS

| | | | |
|---|---|---|---|
| 4,293,767 A * | 10/1981 | Fischer et al. | 250/308 |
| 6,733,923 B2 | 5/2004 | Yun et al. | |
| 7,736,802 B1 * | 6/2010 | Smyth | 429/211 |
| 8,274,056 B2 * | 9/2012 | Akers et al. | 250/367 |
| 2005/0079421 A1 | 4/2005 | Konishiike et al. | |
| 2011/0039017 A1 | 2/2011 | Okazaki et al. | |

FOREIGN PATENT DOCUMENTS

| | | |
|---|---|---|
| JP | 08-219748 | 8/1996 |
| JP | 2000-353515 | 12/2000 |
| JP | 2002-025541 | 1/2002 |
| JP | 2002-231221 | 8/2002 |
| JP | 2003-068281 | 3/2003 |
| JP | 2004-303597 | 10/2004 |
| JP | 2005-085632 | 3/2005 |
| JP | 2007-317419 | 12/2007 |
| JP | 2010-140793 | 6/2010 |
| WO | WO 2009/142019 A1 | 11/2009 |

* cited by examiner

HIGH ENERGY BETA RAY ($^{147}$Pm 0.224MeV)

LOW ENERGY BETA RAY ($^{14}$C 0.156MeV)

DEPOSITION QUANTITY MEASURING APPARATUS, DEPOSITION QUANTITY MEASURING METHOD, AND METHOD FOR MANUFACTURING ELECTRODE FOR ELECTROCHEMICAL ELEMENT

RELATED APPLICATIONS

This application is the U.S. National Phase under 35 U.S.C. §371 of International Application No. PCT/JP2010/004365, filed on Jul. 2, 2010, which in turn claims the benefit of Japanese Application No. 2009-172708, filed on Jul. 24, 2009, the disclosures of which Applications are incorporated by reference herein.

TECHNICAL FIELD

The present invention relates to a deposition quantity measuring apparatus, a deposition quantity measuring method, and a method for manufacturing electrode for an electrochemical element.

BACKGROUND ART

A positive electrode and a negative electrode for a lithium secondary battery are charged and discharged through absorption and desorption of lithium. However, the absorption and desorption are not completely reversible reactions. A large ratio of the lithium that has been absorbed in the negative electrode during initial charge may fail to be desorbed from the negative electrode during discharge. The difference in capacity between during charge and during discharge caused by the lithium that cannot be desorbed is called an irreversible capacity. If the irreversible capacity at the time of the initial charge is large, the use efficiency of the lithium stored in the positive electrode is reduced. This hinders the improvement of charge/discharge capacity.

To solve the foregoing problem, a method of allowing lithium to be absorbed and stored in a negative electrode active material layer before assembly of a lithium secondary battery so as to reduce the irreversible capacity is known (for example, JP 2004-303597 A). Particularly, a method of performing vapor deposition of a lithium-containing material and thereby allowing lithium to be absorbed through the surface of a negative electrode active material layer is excellent in uniformity and continuous processing, which has therefore been studied widely.

CITATION LIST

Patent Literature

Patent Literature 1: JP 2004-303597 A

SUMMARY OF INVENTION

Technical Problem

In the case of reducing the irreversible capacity by vapor deposition, it is desirable that the deposition quantity of lithium is controlled so that the initial irreversible capacity should be equal to zero. When the deposition quantity is insufficient, it is impossible to sufficiently reduce the loss of the charge/discharge capacity caused by the initial irreversible capacity. When the deposition quantity is excessive, some of lithium may fail to diffuse into the negative electrode active material layer and remain on the surface of the negative electrode active material layer. The lithium remaining on the surface of the negative electrode active material layer deteriorates the charge/discharge characteristics.

Accordingly, it is necessary to perform vapor deposition while appropriately controlling the deposition quantity of lithium and the diffusion of lithium into the negative electrode active material layer. The present invention provides a novel technique to accomplish this object.

Solution to Problem

That is, the present invention provides a method for manufacturing an electrode for an electrochemical element including: a deposition step of allowing lithium to deposit on a substrate provided with a layer capable of forming a compound together with lithium; a first beta ray irradiation step of emitting a first beta ray using a first beta radiation source and a second beta ray using a second beta radiation source that includes a different type of nuclide from the nuclide of the first beta radiation source, toward the substrate for irradiation before the deposition step; a first measurement step of measuring the backscattering, from the substrate, of the first beta ray and the second beta ray emitted in the first beta ray irradiation step; a second beta ray irradiation step of emitting the first beta ray and the second beta ray toward the substrate for irradiation after the deposition step; a second measurement step of measuring the backscattering, from the substrate, of the first beta ray and the second beta ray emitted in the second beta ray irradiation step; a calculation step of calculating the decrement in the backscattering of the first beta ray and the decrement in the backscattering of the second beta ray, using the results obtained in the first measurement step and the results obtained in the second measurement step; and a control step of controlling the deposition step depending on the decrement in the backscattering of the first beta ray and the decrement in the backscattering of the second beta ray.

According to another aspect, the present invention provides a deposition quantity measuring apparatus for measuring the quantity of lithium deposited on a substrate provided with a layer capable of forming a compound together with lithium. The apparatus includes: a first beta radiation source that emits a first beta ray toward the substrate for irradiation; a second beta radiation source that includes a different type of nuclide from the nuclide of the first beta radiation source and that emits a second beta ray toward the substrate for irradiation; and a beta ray detector that measures the backscattering, from the substrate, of the first beta ray and the second beta ray emitted respectively from the first beta radiation source and the second beta radiation source.

The present invention, according to still another aspect, provides a deposition quantity measuring method including: a deposition step of allowing lithium to deposit on a substrate provided with a layer capable of forming a compound together with lithium; a first beta ray irradiation step of emitting a first beta ray using a first beta radiation source and a second beta ray using a second beta radiation source that includes a different type of nuclide from the nuclide of the first beta radiation source, toward the substrate for irradiation before the deposition step; a first measurement step of measuring the backscattering, from the substrate, of the first beta ray and the second beta ray emitted in the first beta ray irradiation step; a second beta ray irradiation step of emitting the first beta ray and the second beta ray toward the substrate for irradiation after the deposition step; a second measurement step of measuring the backscattering, from the substrate, of the first beta ray and the second beta ray emitted in the second beta ray irradiation step; and a calculation step of calculating the decrement in the backscattering of the first beta ray and the decrement in the backscattering of the second beta ray, using the results obtained in the first measurement step and the results obtained in the second measurement step.

The present invention, according to further another aspect, provides a method for manufacturing electrode for an electrochemical element. The method includes: a step of preparing a substrate provided with a layer capable of forming a compound together with lithium; a deposition step of allowing lithium to deposit on the substrate while adjusting the temperature of the substrate to a temperature between a first threshold temperature and a second threshold temperature so as to allow the lithium that has deposited on the substrate to diffuse into the substrate and so as to suppress thermal damage of the substrate; a beta ray irradiation step of emitting a beta ray toward the substrate for irradiation before the deposition step; a measurement step of measuring the backscattering, from the substrate, of the beta ray emitted in the beta ray irradiation step; a second beta ray irradiation step of emitting the beta ray toward the substrate for irradiation after the deposition step; a second measurement step of measuring the backscattering, from the substrate, of the beta ray emitted in the second beta ray irradiation step; a calculation step of calculating the decrement in the backscattering of the beta ray using the result obtained in the first measurement step and the result obtained in the second measurement step; and a control step of controlling the deposition step depending on the decrement in the beta ray.

Advantageous Effects of Invention

According to the present invention, two types of beta radiation sources (the first beta radiation source and the second beta radiation source) are used. As will be described later in detail, the use of two types of beta radiation sources makes it possible to know (i) whether or not lithium has sufficiently diffused into the layer capable of forming a compound together with lithium and (ii) the deposition quantity of lithium. These two pieces of information are useful to appropriately control the deposition quantity of lithium and the diffusion of lithium into the substrate.

Typically, using these two pieces of information, the control step can be performed so that the deposition quantity approaches a target value. Similarly, the control step can be performed so that lithium diffuses into the substrate without fail. As a result, it is possible to manufacture an electrode for an electrochemical element that can achieve a reliable reduction in the initial irreversible capacity.

On the other hand, only if certain conditions are satisfied, it is possible to accurately control the deposition quantity of lithium also in the case of using one type of beta radiation source. Specifically, lithium is allowed to deposit on the substrate while adjusting the temperature of the substrate to a temperature between the first threshold temperature and the second threshold temperature so as to allow the lithium that has deposited on the substrate to diffuse into the substrate and so as to suppress thermal damage of the substrate. In this case, it is enough to measure only the deposition quantity of lithium using beta ray backscattering. That is, the control step is performed so that the deposition quantity of lithium approaches a target value. In this way, it is possible to manufacture an electrode for an electrochemical element that can achieve a reliable reduction in the initial irreversible capacity.

Of course, there are many cases where it is not easy to appropriately adjust the temperature of the substrate. In such a case, the method of using two types of beta radiation sources is recommended.

DESCRIPTION OF EMBODIMENTS

Hereinafter, an embodiment of the present invention is described with reference to the drawings.

<Principle of Measurement of Deposition Quantity Using Beta Ray Backscattering>

Figure 4A:
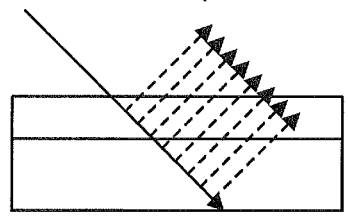
FIG. 4A is a schematic view showing the backscattering of a high energy beta ray (first beta ray).
Figure 4B:
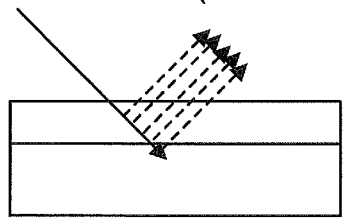
FIG. 4B is a schematic view showing the backscattering of a low energy beta ray (second beta ray).

As shown in FIG. 4A, a high energy beta ray enters a layer (substrate) to a comparatively deep portion and is scattered. Therefore, the backscattering of the high energy beta ray includes information on the layer from the surface to the deep portion. On the other hand, as shown in FIG. 4B, a low energy beta ray is scattered in the vicinity of the surface of the layer. Therefore, the backscattering of the low energy beta ray is not much affected by the deep portion of the layer, and mainly includes information on the layer in the vicinity of the surface.

Figure 5:
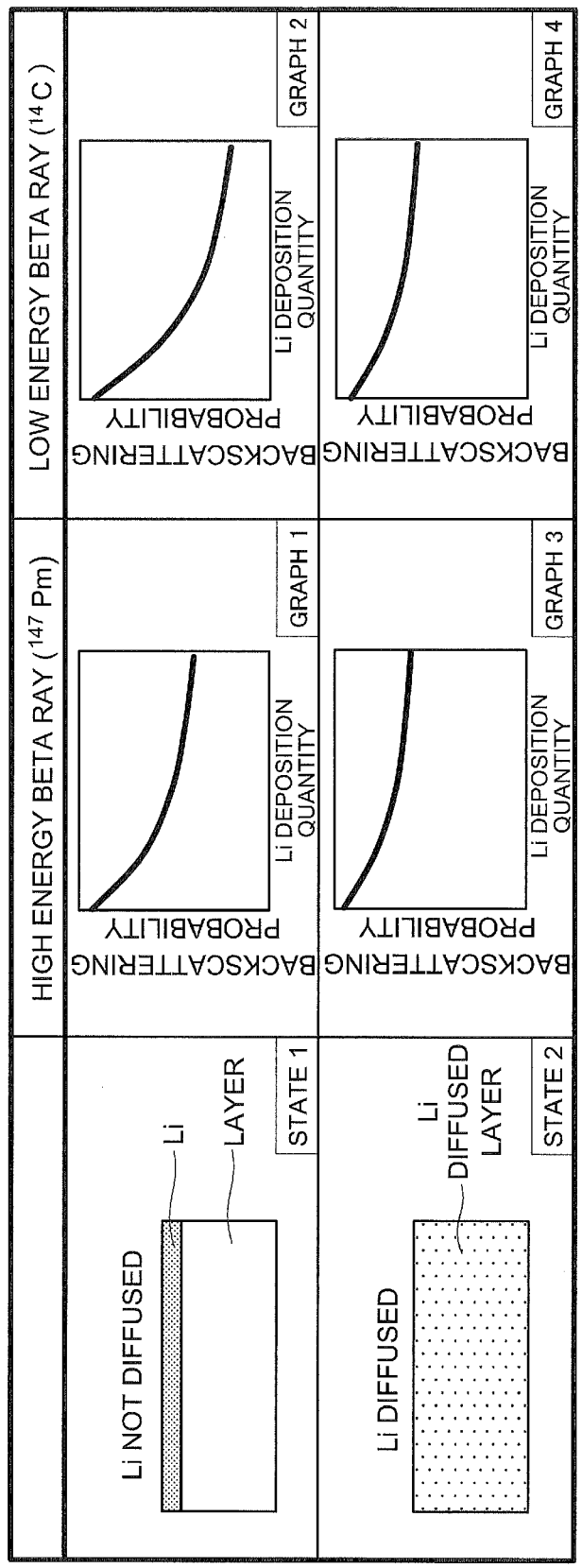
FIG. 5 is a correlation diagram showing the relationship between the diffusion state of lithium and the backscattering of each beta ray.

The backscattering probability when the surface of a layer is irradiated with a beta ray is known to be almost proportional to the logarithm of the atomic number of the material that forms the layer. In the case of a compound, it is almost proportional to the logarithm of the mass average of the atomic numbers of the elements contained in the layer. Beta rays are unlikely to be scattered by a light element, and therefore when lithium is contained (diffused) in an active material layer such as a silicon thin film, the backscattering probability (backscattering yield) of beta rays is reduced. In the case where the quantity of lithium contained in the active material layer is small with respect to the elements of the active material layer such as a silicon thin film, the backscattering probability of beta rays is reduced almost in proportion to the quantity of lithium contained in the active material layer. Specifically, as shown in state 2 of FIG. 5, in the case where lithium in the form of a thin film does not remain on the surface of the layer and lithium is diffused into the layer, the backscattering probability is reduced almost in proportion to the quantity of lithium contained in the layer. This principle is not related to the energy of the beta ray. Accordingly, as shown in graph 3 and graph 4 of FIG. 5, the profile of the backscattering probability of high energy beta ray with respect to the deposition quantity of lithium almost matches that of low energy beta ray.

On the other hand, in the case where the layer has a non-uniform composition, the backscattering probability of a beta ray is a little bit more complicated. For example, as shown in state 1 of FIG. 5, consideration is given to the case where a light element is unevenly distributed in the vicinity of the surface of the layer, in other words, lithium in the form of a thin film is deposited on the surface of the layer. In this case, as shown in graph 1 and graph 2 of FIG. 5, the backscattering probability of high energy beta ray and the backscattering probability of low energy beta ray are significantly reduced depending on the deposition quantity of lithium. However, the profile of the backscattering probability of high energy beta ray does not match the profile of the backscattering probability of low energy beta ray. As has been described with reference to FIG. 4B, since the low energy beta ray is backscattered in the vicinity of the surface of the layer, the backscattering probability of low energy beta ray is significantly reduced even if the deposition quantity of lithium is comparatively small. As has been described with reference to FIG. 4A, the high energy beta ray enters the layer to a comparatively deep portion, and therefore the backscattering probability of high energy beta ray is reduced gradually depending on the deposition quantity of lithium as compared to the backscattering probability of low energy beta ray. That is, when lithium is unevenly distributed around the surface, the percentage of reduction in the backscattering probability of low energy beta ray exceeds the percentage of reduction in the backscattering probability of high energy beta ray.

In the embodiment to be described later, $^{147}$Pm that emits a 0.224 MeV beta ray is used as a nuclide of high energy beta ray (first beta ray), and $^{14}$C that emits a 0.156 MeV beta ray is used as a nuclide of low energy beta ray (second beta ray). Usually, about 10 μm-thick lithium deposition is sufficient to reduce the initial irreversible capacity in a common negative electrode for a lithium secondary battery, and absorption of lithium into the active material layer occurs in the range of several 10 μm from the surface. That is, only whether lithium is unevenly distributed on the surface or diffused into the layer needs to be determined within the region of about 10 μm from the surface. It is suitable to use beta rays at a plurality of energy levels in the range of 0.1 to 0.3 MeV, in order to detect a beta ray scattering from the vicinity of the surface and a beta ray scattering from the inside (to 10 μm) in this region. Within this energy range, those having a long half-life (at least one year) and a lower limit of the quantity that is not small as required by Ordinance on Prevention of Ionizing Radiation Hazards are $^{147}$Pm and $^{14}$C. Therefore, these are used as nuclides in this embodiment.

Of course, $^{147}$Pm and $^{14}$C are not necessarily essential as nuclides for embodying the present invention. Any nuclides can be used as long as they can emit beta rays at different energy levels from each other.

<Configuration of Vacuum Vapor Deposition Apparatus 100>

Figure 1:
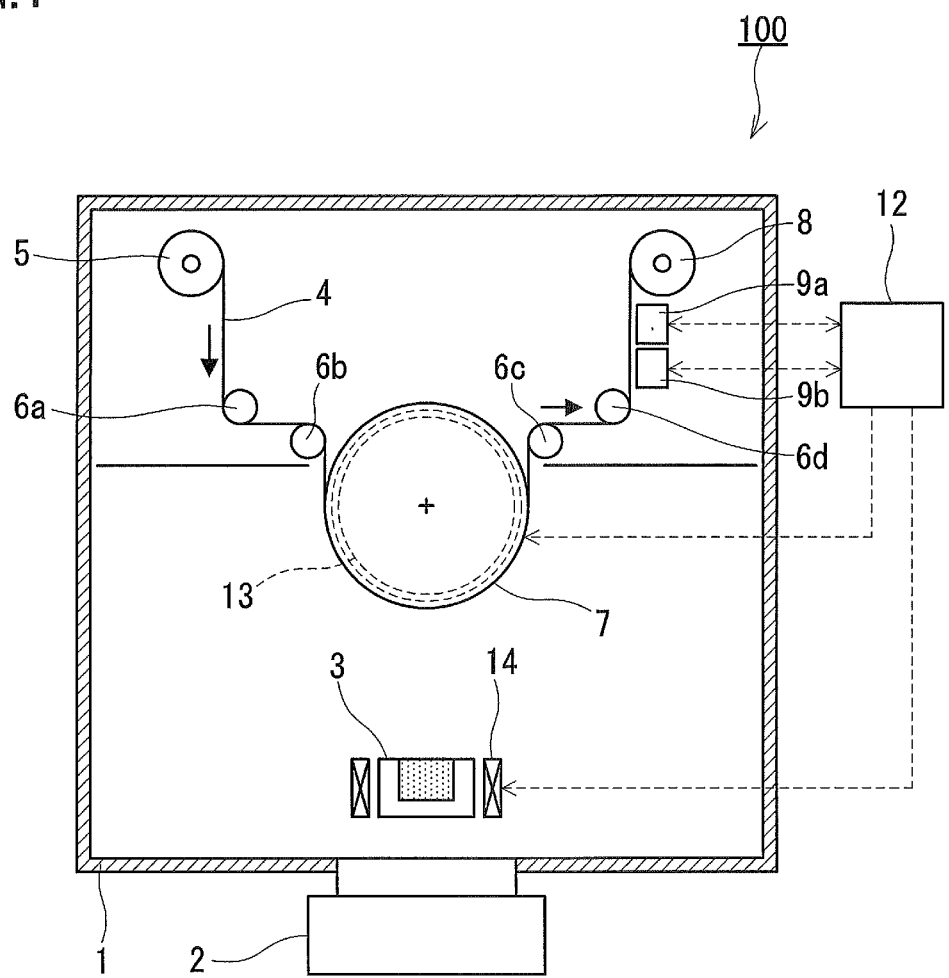
FIG. 1 is a schematic view showing the structure of a vacuum vapor deposition apparatus that can be used for embodying the present invention.

FIG. 1 shows a schematic view of a vacuum vapor deposition apparatus that can be used for embodying the present invention. A vacuum vapor deposition apparatus 100 functions not only to perform vapor deposition of a material onto a substrate 4 but also to measure the deposition quantity of the vapor-deposited material as a deposition quantity measuring apparatus. As shown in FIG. 1, the vacuum vapor deposition apparatus 100 is constituted by a vacuum chamber 1, a vacuum pump 2, an evaporation source 3, a feed roll 5, conveyor rolls 6a to 6d, a can roll 7, a winding roll 8, a first beta ray backscatter detection probe 9a, and a second beta ray backscatter detection probe 9b. Hereinafter, the first beta ray backscatter detection probe 9a and the second beta ray backscatter detection probe 9b are simply referred to as "the first probe 9a" and "the second probe 9b", respectively.

In order to allow lithium to deposit on the substrate 4, the evaporation source 3 can be used. For the evaporation source 3, a crucible made of metal that does not react with lithium, for example, is used. The evaporation source 3 is heated by a heating apparatus such as a resistance heating apparatus, an induction heating apparatus, and an electron beam heating apparatus, thereby allowing the material (lithium) accommodated in the crucible of the evaporation source 3 to evaporate. In this apparatus 100, a resistance heating apparatus 14 is used.

In this embodiment, vacuum vapor deposition is employed as a method for allowing lithium to deposit on the substrate 4. However, other dry deposition method such as sputtering method can be employed, instead of vacuum vapor deposition.

The vacuum vapor deposition apparatus 100 further includes a controller 12. The controller 12 controls the first probe 9a, the second probe 9b, the resistance heating apparatus 14, and the can roll 7.

The substrate 4 on which lithium is to be deposited is set on the feed roll 5, and guided to the winding roll 8 along the conveyor roll 6a, the conveyor roll 6b, the can roll 7, the conveyor roll 6c, and the conveyor roll 6d. The feed roll 5, the conveyor rolls 6a to 6d, the can roll 7, and the winding roll 8 constitute a conveying system for conveying the substrate 4. The substrate 4 is normally conveyed at a constant speed by the conveying system. However, it also is possible to control the conveying speed for the substrate 4 in order to adjust the deposition rate of lithium onto the substrate 4.

The evaporation source 3 faces the substrate 4 extending along the outer circumference of the can roll 7. The reachable range of the evaporated material rising straight up is the deposition area. The can roll 7 has a cylindrical shape. A temperature adjusting mechanism 13 is provided (integrated) in the can roll 7. The temperature adjusting mechanism 13 is composed, for example, of a flow path for allowing refrigerant or heat carrier to flow therethrough. It is possible to control the temperature of the substrate 4 by varying the flow rate and/or temperature of the refrigerant or heat carrier flowing inside the temperature adjusting mechanism 13. Water, hot water, oil, etc. can be used as the refrigerant or heat carrier.

As the substrate 4, a current collector on which an active material layer of an electrochemical element is formed can be used. Specifically, a current collector provided with a layer made of material capable of forming a compound together with lithium can be used as the substrate 4. More specifically, a current collector on which a thin film of a substance capable of absorbing and desorbing lithium is formed can be used as the substrate 4. For example, a current collector on which a silicon-containing thin film is formed can be used as the substrate 4. As a current collector, a foil made of metal such as copper, copper alloy, aluminium, aluminium alloy, nickel, and nickel alloy can be used. As an electrochemical element, a lithium secondary battery and a lithium ion capacitor can be mentioned.

In recent years, as miniaturization and multifunctionalization of portable equipment proceed, the demand for high capacity battery as a power source of portable equipment is increasing. At present, the theoretical capacity of carbon that is mainly used as a negative electrode active material for a lithium secondary battery is 372 mAh/g. Various active materials that can increase the capacity more than carbon have been studied. Particularly, silicon having a theoretical capacity of 4200 mAh/g is regarded as a promising material, and multiple kinds of silicon-containing materials have been studied.

The problem concerning the initial irreversible capacity can occur not only in the case of using silicon as an active material but also in the case of using other active materials. Examples of other active materials include carbon materials such as graphite, and alloy-type active materials other than silicon such as tin.

In order to allow the lithium that has deposited on the surface of an active material layer to be absorbed into the active material layer, the active material layer is required to be heated to at least a temperature that causes sufficient thermal diffusion. However, excessively high temperature causes problems such as a change in structure of the material for the active material or the current collector, and a decrease in strength of the current collector. Accordingly, the temperature control at the time of the absorption of lithium into the active material layer is important.

The first probe 9a and the second probe 9b each integrate a sealed radiation source that emits a beta ray and a radiation detector that is capable of detecting the beta ray. As a nuclide of each beta radiation source, any one of those emitting a beta ray can be used. In this apparatus 100, a $^{147}$Pm sealed radiation source with a radioactivity of 3.7 MBq (first beta radiation source) is used for the first probe 9a, and a $^{14}$C sealed radiation source with a radioactivity of 1.6 MBq (second beta radiation source) is used for the second probe 9b. As a radiation detector, any one of those that is operable under vacuum and is capable of detecting a beta ray can be used. In this apparatus 100, a silicon PIN photodiode detector is used.

<Operation of Vacuum Vapor Deposition Apparatus 100>

Figure 3:
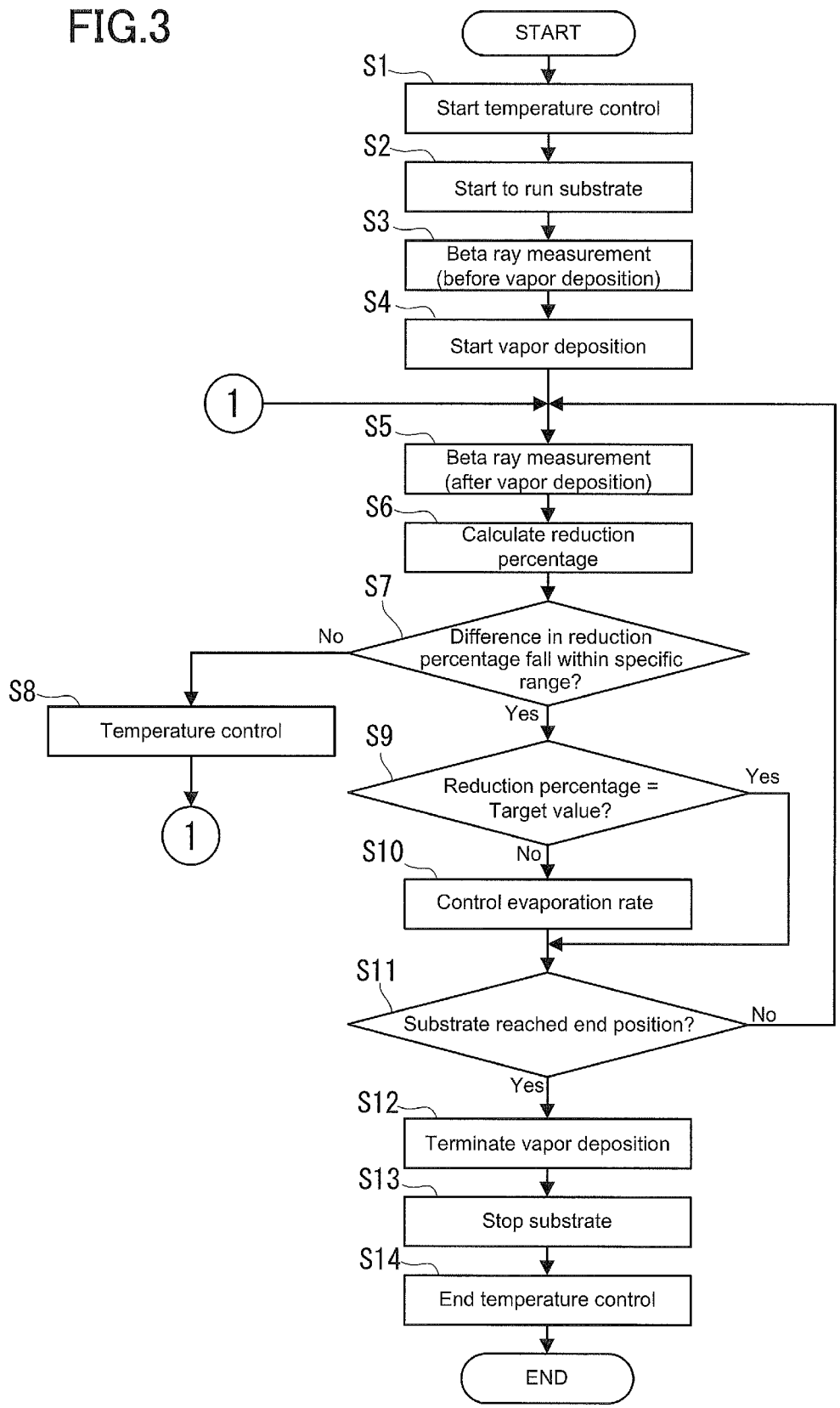
FIG. 3 is a flow chart showing the control of vapor deposition in the embodiment of the present invention.

Next, the operation of the vacuum vapor deposition apparatus 100 is described with reference to FIG. 3. FIG. 3 shows a process to be performed by the controller 12. It should be noted that the vacuum degree inside the vacuum chamber 1 is maintained at a vacuum degree suitable for evaporating lithium and measuring the backscattering yield of a beta ray, for example, in the range of $10^{-1}$ to $10^{-4}$ Pa. In order to properly determine "the percentage of reduction in the backscattering yield", the vacuum degree should be maintained at almost constant. However, vacuum is not necessarily essential for the present invention, and the present invention can be applied to lithium deposition in the ambient atmosphere.

First, refrigerant or heat carrier is allowed to flow into the temperature adjusting mechanism 13 provided in the can roll 7, and the temperature control of the substrate 4 by the temperature adjusting mechanism 13 is started (step S1). Next, the substrate 4 is driven to run (step S2). The elongated substrate 4 unrolled from the feed roll 5 is introduced along the conveyor roll 6a, the conveyor roll 6b, the can roll 7, the conveyor roll 6c, and the conveyor roll 6d, in this order, and is eventually rolled up on the winding roll 8.

(First Beta Ray Irradiation Step and First Measurement Step)

Next, the first beta ray and the second beta ray are emitted to the running substrate 4 for irradiation using the first probe 9a and the second probe 9b. The backscattering yield, from the substrate 4, of each of the first beta ray and the second beta ray is measured (step S3). That is, the backscattering yield is measured for the substrate 4 before lithium deposition. Thus, the backscattering yield when the deposition quantity of lithium is zero is obtained for each of the first beta ray and the second beta ray.

Also when the backscattering yield is measured for the substrate 4 before lithium deposition, the measurement is preferably performed while the substrate 4 is running. This is because, even if the backscattering yield is non-uniform to some extent in the plane of the substrate 4, the measurement with the substrate 4 running allows the non-uniformity to be averaged, so that an accurate value tends to be obtained. Particularly, in the case where the surface of the substrate 4 is rough, or the substrate 4 has a non-uniform density in a plane, it is desirable to measure the backscattering yield while the substrate 4 is running.

(Deposition Step)

Subsequently, lithium metal is put into the evaporation source 3 as a material, and is evaporated by raising the temperature with resistance heating (step S4). Normally, the deposition rate is 1 to 1000 nm/second, and the deposition quantity of lithium (thickness in terms of a thin film) is 1 to 10 μm. The use of the elongated substrate 4 makes it possible to perform the step of allowing lithium to deposit on the substrate 4 while performing the step of conveying the substrate 4. This method allows excellent productivity. Further, it is possible to perform the second beta ray irradiation step and the second measurement step to be described later while performing the conveyance step and the deposition step.

However, it also is possible to perform the conveyance step and the deposition step intermittently, that is, to perform the conveyance step and the deposition step alternately. In order to form a lithium-deposited portion and a non-deposited portion on the elongated substrate 4, such an intermittent method is useful.

The temperature of the substrate 4 during vapor deposition varies depending on the balance between heating due to the condense heat of the deposited lithium metal or the radiation heat from the evaporation source 3, and heat dissipation to the can roll 7 in contact with the back surface of the substrate 4. It is possible to control the maximum attained temperature of the substrate 4 during vapor deposition by varying the temperature or flow rate of refrigerant or heat carrier flowing inside the can roll 7 (the temperature adjusting mechanism 13). The actual maximum attained temperature of the substrate 4 can be determined using a thermolabel attached to the back surface or from the decrease in the tensile strength of the metal foil used for the substrate 4.

(Second Beta Ray Irradiation Step and Second Measurement Step)

Next, the first beta ray and the second beta ray are emitted to the substrate 4, on which lithium metal is vapor deposited, for irradiation using the first probe 9a and the second probe 9b. The backscattering yield, from the substrate 4, of each of the first beta ray and the second beta ray is measured (step S5). The backscattering yield is expressed as the yield per unit time, e.g., for one second (count per sec).

In this embodiment, the backscattering yield is measured while the substrate 4 is conveyed. Therefore, the backscattering yield per unit time shows the mean value for a certain region.

(Calculation Step)

Next, using the measurement results for the substrate 4 before vapor deposition obtained in the first measurement step and the measurement results for the substrate 4 after vapor deposition obtained in the second measurement step, the percentage of reduction (decrement) in the backscattering yield per unit time is calculated for each of the first beta ray and the second beta ray (step S6). The percentage of reduction can be calculated according to the following equations:

(The percentage of reduction (%) in the backscattering yield of the first beta ray)=$100 \times (X_0 - X_1)/X_0$, and (The percentage of reduction (%) in the backscattering yield of the second beta ray)=$100 \times (Y_0 - Y_1)/Y_0$, where $X_0$ denotes the backscattering yield of the first beta ray before vapor deposition, $X_1$ denotes the backscattering yield of the first beta ray after vapor deposition, $Y_0$ denotes the backscattering yield of the second beta ray before vapor deposition, and $Y_1$ denotes the backscattering yield of the second beta ray after vapor deposition.

(Control Step)

Next, whether or not the difference between the percentage of reduction in the backscattering yield of the first beta ray and the percentage of reduction in the backscattering yield of the second beta ray falls within a specific range is determined (step S7). When the difference in the percentage of reduction falls within a specific range, lithium is regarded as being diffused into the substrate 4, and vapor deposition is continued as it is without changing the current vapor deposition conditions. The "specific range" is a range determined in consideration of measurement error. For example, in the case where the difference in the percentage of reduction falls within the range of ±3%, lithium can be regarded as being generally diffused into the substrate 4.

In contrast, when the difference between the percentage of reduction in the backscattering yield of the first beta ray and the percentage of reduction in the backscattering yield of the second beta ray does not fall within the specific range, lithium is regarded as having failed to diffuse into the substrate 4 and forming a thin film on the substrate 4 in the form of lithium metal. In this case, the temperature control of the substrate 4 is performed (step S8). Specifically, the temperature of refrigerant or heat carrier is raised. An increase in the temperature of refrigerant or heat carrier causes an increase in the temperature of the substrate 4 and therefore promotes the lithium diffusion into the substrate 4. This reduces the difference in the percentage of reduction. Thereafter, the process returns to step S5, and the backscattering yield measurement (step S6) and the reduction percentage calculation (step S7) are performed again.

After the difference in the percentage of reduction is determined to be within a specific range, whether or not the percentage of reduction in the backscattering yield of the first beta ray or the second beta ray matches a target value is determined (step S9). To be precise, whether or not the reduction percentage falls within the target range is determined. When the reduction percentage matches the target value (within the target range), the deposition quantity of lithium is determined to be appropriate, and vapor deposition is continued as it is without changing the current vapor deposition conditions.

On the other hand, when the reduction percentage does not match the target value (out of the target range), the evaporation rate control is performed (step S10). Specifically, in the case where the reduction percentage exceeds the target value, the deposition quantity of lithium is excessive and thus the heating apparatus 14 is controlled so that the lithium evaporation rate from the evaporation source 3 decreases (specifically, the current is reduced). In the case where the reduction percentage falls below the target value, the deposition quantity of lithium is insufficient and thus the heating apparatus 14 is controlled so that the lithium evaporation rate from the evaporation source 3 increases (the current is increased).

In this way, the temperature control is performed so that the difference in the percentage of reduction in the backscattering yield of beta rays falls within a specific range. In addition, vapor deposition is performed so that the percentage of reduction in the backscattering yield of the first beta ray or the second beta ray matches the target value (falls within a target range). After it is assured that the substrate 4 has reached the end position, vapor deposition is terminated, the substrate 4 is stopped, and the temperature control is ended (steps S11 to S14).

According to this embodiment, the deposition step is performed while the conveyance step is performed so that a deposited portion where lithium is deposited and a non-deposited portion where lithium is not deposited are formed on the elongated substrate 4. The deposited portion is subjected to the second beta ray irradiation step, the second measurement step, and the calculation step. The control step is performed so that the results of the calculation step are fed back to the deposition step for allowing lithium to deposit on the non-deposited portion. In this way, it is possible to allow lithium to diffuse into the substrate 4 while controlling the deposition quantity of lithium.

Further, according to this embodiment, the calculation step includes calculating the percentage of reduction in the backscattering of the first beta ray from the decrement in the backscattering of the first beta ray, and calculating the percentage of reduction in the backscattering of the second beta ray from the decrement in the backscattering of the second beta ray. In the control step, whether or not the difference between the percentage of reduction in the backscattering of the first beta ray and the percentage of reduction in the backscattering of the second beta ray falls within a specific range is determined, and when it does not fall within the specific range, the deposition step is controlled so that the temperature of the substrate 4 is raised. In the case where the difference between the percentage of reduction in the backscattering of the first beta ray and the percentage of reduction in the backscattering of the second beta ray falls within the specific range, whether or not the percentage of reduction in the backscattering of the first beta ray or the percentage of reduction in the backscattering of the second beta ray falls within a target range is determined. When it does not fall within the target range, the deposition step is controlled so that the deposition rate of lithium is increased.

The difference between the percentage of reduction in the backscattering yield of the first beta ray and the percentage of reduction in the backscattering yield of the second beta ray indicates the degree of uneven distribution of lithium in the substrate 4, that is, the state of lithium diffusion into the substrate 4. On the other hand, the percentage of reduction in the backscattering yield of the first beta ray and the percentage of reduction in the backscattering yield of the second beta ray each indicate the deposition quantity of lithium. According to this embodiment, it is possible to perform vapor deposition of lithium onto the substrate 4 while appropriately controlling the lithium deposition and the lithium diffusion into the substrate 4.

Each step shown in FIG. 3 is automatically performed by the operation of the controller 12. That is, the controller 12 controls the first probe 9a and the second probe 9b so as to emit the first beta ray and the second beta ray toward the substrate 4 before lithium deposition for irradiation, thereby allowing the backscattering of the first beta ray and the backscattering of the second beta ray to be measured. Further, the controller 12 controls the first probe 9a and the second probe 9b so as to emit the first beta ray and the second beta ray toward the substrate 4 after lithium deposition for irradiation, thereby allowing the backscattering of the first beta ray and the backscattering of the second beta ray to be measured. In addition, the controller 12 calculates the decrement in the backscattering of the first beta ray and the decrement in the backscattering of the second beta ray each before and after lithium deposition. The controller 12 performs the subsequent control of the deposition step based on the calculation results. That is, the controller 12 determines whether or not the current deposition conditions (such as the temperature of the substrate 4, the deposition rate of lithium) are appropriate, using the calculation results. When determined to be appropriate, the current deposition conditions are maintained. When determined to be inappropriate, the deposition conditions are corrected.

In this embodiment, lithium diffusion into the substrate 4 is appropriately controlled by temperature control during vapor deposition. Specifically, according to this embodiment, the step of conveying the substrate 4 includes conveying the substrate 4 along the cylindrical can roll 7. A region for allowing lithium to deposit exists at a position where the substrate 4 extends along the can roll 7. The step of controlling the deposition step includes controlling the temperature of the can roll 7, specifically, controlling the temperature of the substrate 4 using the temperature adjusting mechanism 13 provided in the can roll 7. That is, the temperature of the substrate 4 is adjusted by controlling the temperature of the can roll 7 so that the deposited lithium is allowed to diffuse into the substrate 4. By controlling the temperature of the can roll 7, it is possible to adjust the temperature of the substrate 4 in the region for allowing lithium deposition. Thus, a fast response can be obtained. Further, the temperature of the substrate 4 can be reliably prevented from excessively increasing or excessively decreasing.

However, in the case where the temperature during vapor deposition is insufficient for diffusion, it also is possible to appropriately control lithium diffusion into the substrate 4 by heating the substrate 4 using another heat source after vapor deposition. For example, at least one of the conveyor roll 6c and the conveyor roll 6d disposed downstream of the can roll 7 in the conveyance direction of the substrate 4 can be constituted by a heating roll. The "heating roll" is a roll that functions to heat the substrate 4. In the case where the step of conveying the substrate 4 includes conveying the substrate 4 along the heating roll, the substrate 4 is conveyed along the heating roll after passing through the region for allowing lithium deposition. It is possible to promote or suppress lithium diffusion into the substrate 4 by adjusting the power of the heating roll for heating the substrate 4. In this case, the step of controlling the deposition step includes controlling the temperature of the heating roll. Thus, the method of positively heating the substrate 4 is effective in the case where the distance between the substrate 4 and the evaporation source 3 is comparatively large and the temperature of the substrate 4 cannot be raised sufficiently during vapor deposition.

According to this embodiment, the deposition step includes evaporating lithium from the evaporation source 3 so that lithium is deposited on the substrate 4. The step of controlling the deposition step includes controlling the evaporation rate from the evaporation source 3. The lithium evaporation rate from the evaporation source 3 is controlled by adjusting the power of the heating apparatus 14 for heating the evaporation source 3. In other words, the deposition rate of lithium is adjusted by controlling the evaporation source 3 so that the deposition quantity of lithium approaches the target value. Thus, the deposition quantity of lithium onto the substrate 4 can be adjusted.

Modified Embodiment

On the premise that the substrate 4 is maintained at a temperature suitable for lithium diffusion, it is possible to allow lithium to deposit on the substrate 4 while monitoring the deposition quantity using one beta radiation source. For example, the temperature conditions that allow lithium to diffuse into the substrate 4 without fail (cooling or heating conditions for the can roll 7) can be found by conducting the following preliminary experiment. Specifically, lithium is deposited on the substrate 4 under several sets of the cooling or heating conditions for the can roll 7. The percentage of reduction in the backscattering yield of the first beta ray and the percentage of reduction in the backscattering yield of the second beta ray are calculated and compared to each other. When the reduction percentages generally match, lithium is sufficiently diffused into the substrate 4, which demonstrates that the cooling or heating conditions at that time are appropriate.

In actual lithium deposition onto the substrate 4, the cooling or heating conditions for the can roll 7 are fixed. The evaporation rate is controlled depending on the backscattering yield of a beta ray using $^{147}$Pm as a nuclide, so that the deposition quantity of lithium can be adjusted to a specific value. For example, when the percentage of reduction in the backscattering yield of the beta ray that uses $^{147}$Pm as a nuclide falls below a target value, the temperature of the evaporation source 3 is raised and the evaporation rate of lithium is increased. When the percentage of reduction in the backscattering yield exceeds the target value, the temperature of the evaporation source 3 is lowered and the evaporation rate of lithium is decreased. In this way, it is possible to control the deposition quantity of lithium to a specific value. The energy of the beta ray is not specifically limited.

That is, the step of allowing lithium to deposit on the substrate 4 can be performed while adjusting the temperature of the substrate 4 to a temperature between the first threshold temperature and the second threshold temperature so as to allow the lithium that has deposited on the substrate 4 to diffuse into the substrate 4 and so as to suppress thermal damage of the substrate 4. The "first threshold temperature" is a minimum temperature that is necessary to allow lithium to diffuse into the substrate 4. The "second threshold temperature" is a maximum temperature that is necessary to prevent thermal damage of the substrate 4. In the case of the substrate 4 made of copper or copper alloy, the first threshold temperature, for example, is 250° C., preferably 300° C., and the second threshold temperature, for example, is 400° C., preferably 350° C.

When only one beta radiation source is used, the step of controlling the deposition step includes controlling the deposition rate of lithium onto the substrate 4. Specifically, it is sufficient to control only the deposition rate of lithium. Accordingly, a feedback system can be designed easily and production cost can be reduced.

It should be noted that various technical matters described in the embodiment using two beta radiation sources (probe 9a and 9b) can be applied to the modified embodiment that uses one beta radiation source as long as no contradiction occurs.

Examples

Using the deposition quantity measuring apparatus (vacuum vapor deposition apparatus) and the deposition quantity measuring method that have been described in the embodiment, a negative electrode for a lithium secondary battery was produced. A lithium secondary battery was produced using the negative electrode and the characteristics thereof were measured.

<Producing Negative Electrode>

A 10 μm-thick silicon oxide ($SiO_{0.3}$) thin film was deposited by vapor deposition on a 35 μm-thick electrolytic copper foil having a surface roughened by electrolytic plating. Using the electrolytic copper foil provided with the silicon oxide thin film as a substrate, a negative electrode was produced by conducting vapor deposition of lithium under several sets of conditions shown in Table 1. The substrate was started to run before vapor deposition and the percentage of reduction in the backscattering yield of the first beta ray and the percentage of reduction in the backscattering yield of the second beta ray were measured according to the method described in the embodiment. It should be noted that $^{147}$Pm and $^{14}$C were used, respectively, as the nuclide of the first beta ray and the nuclide of the second beta ray. The deposition rate of lithium was within the range of 0.1 to 1 μm/second in terms of the film thickness.

TABLE 1

|  | Sample 1 | Sample 2 | Sample 3 | Sample 4 | Sample 5 |
|---|---|---|---|---|---|
| Diposition quantity (μm) * | 9.0 | 9.0 | 6.0 | 12.0 | 18.0 |
| Maximum attained temperature of substrate (° C.) | 250 | 150 | 250 | 250 | 250 |
| Percentage of reduction in backscattering yield of first beta ray (%) | 10.7 | 10.9 | 7.0 | 14.2 | 20.9 |
| Percentage of reduction in backscattering yield of second beta ray (%) | 11.2 | 29.5 | 7.1 | 14.6 | 27.1 |

* Values are expressed in terms of the thickness when lithium is not diffused into the substrate and deposited on the surface of the substrate in the form of lithium metal The negative electrode after vapor deposition was put into the atmosphere. As to samples 2 and 5, lithium metal remained on the surface of the negative electrode, and thus samples 2 and 5 were not suitable for use in manufacturing a battery. As to samples 1, 3, and 4, no lithium metal was observed to remain, and lithium had been absorbed substantially completely into the silicon thin film.

The deposition quantity of lithium (in terms of the thickness) was calculated by measuring the weight per unit area of the electrolytic copper foil on which lithium had deposited. The maximum attained temperature of the substrate was measured by checking discoloration of a thermolabel attached to the electrolytic copper foil.

<Producing Lithium Secondary Battery>

Each of the negative electrodes of the samples 1, 3, and 4 obtained by the above-mentioned method and a negative electrode (sample 6) to which lithium was not vapor deposited was punched into a circular shape with a diameter of 12.5 mm. Thus, a negative electrode for a lithium secondary battery was formed. Next, a lithium secondary battery was produced using each of the obtained negative electrodes.

Figure 2:
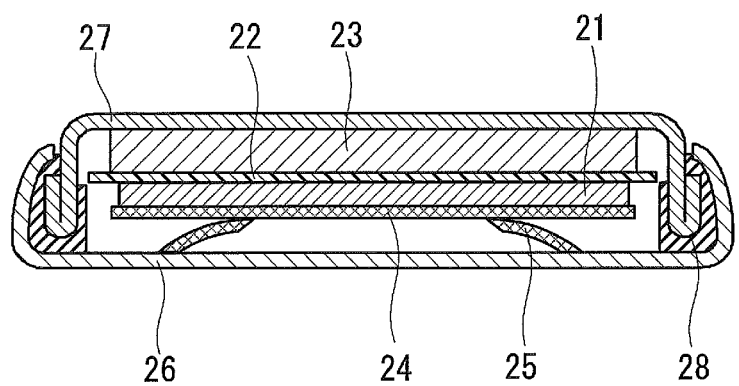
FIG. 2 is a schematic sectional view showing a lithium secondary battery that can be manufactured by the method of the present invention.

FIG. 2 is a schematic sectional view showing a lithium secondary battery produced using the negative electrodes of samples 1, 3, 4, and 6. The lithium secondary battery has an electrode 21 (negative electrode), a counter electrode (metal lithium positive electrode) 23 that faces the electrode 21, and a separator 22 that is interposed between the counter electrode 23 and the electrode 21 and includes an electrolyte that conducts lithium ions. On the surface of the electrode 21 on the side not facing the counter electrode 23, a metal disc 24 for collecting current from the electrode 21 is provided. A disc spring 25 for pressurizing the electrode 21 is disposed between the metal disc 24 and the bottom surface of a coin-shaped battery case 26. The electrode 21 and the counter electrode 23 are accommodated together with a separator 22 and the electrolyte in the coin-shaped battery case 26, which is sealed by a sealing plate 27 having a gasket 28. Further, the battery case 26 and the sealing plate 27 are electrically connected to the electrode 21 and the counter electrode 23, respectively, and function also as positive and negative terminals.

In this example, a coin-shaped lithium secondary battery with a size of 2016 (diameter: 20 mm, thickness: 1.6 mm) was produced using a 300 μm-thick lithium metal foil (manufactured by THE HONJO CHEMICAL CORPORATION) as a counter electrode and a 20 μm-thick polyethylene microporous film (manufactured by Asahi Kasei Corporation) as a separator. As an electrolyte, a solution obtained by dissolving lithium hexafluorophosphate (LiPF$_6$) in a 1:1 (volume ratio) mixed solvent of ethylene carbonate and diethyl carbonate to a concentration of 1 mol/L was used. Electrolyte impregnation was performed by immersing the separator and the electrode (negative electrode) in the electrolyte for 10 seconds.

<Evaluation Method for Lithium Secondary Battery and the Results Thereof>

Subsequently, a charge/discharge cycle test was conducted for the obtained lithium secondary battery.

In the charge/discharge cycle test, each lithium secondary battery accommodated in a thermostatic bath at 20° C. was charged at a constant current of 1 mA/cm$^2$ until the voltage of the battery reached 1.5 V, and then discharged at a constant current of 1 mA/cm$^2$ until the voltage decreased to 0.0 V. The ratio of the discharge capacity with respect to the charge capacity was calculated and was taken as the charge/discharge efficiency.

Table 2 shows the results of the charge/discharge cycle test.

TABLE 2

|  | Sample 1 | Sample 3 | Sample 4 | Sample 6 |
|---|---|---|---|---|
| Charge capacity (m Ah/cm$^2$) | 4.3 | 4.8 | 3.7 | 6.0 |
| Discharge capacity (m Ah/cm$^2$) | 4.2 | 4.1 | 4.1 | 4.2 |
| Charge/discharge efficiency (%) | 98 | 85 | 111 | 70 |

<Consideration Concerning Vapor Deposition of Lithium and Evaluation Results for Lithium Secondary Battery>

As shown in Table 1, the percentage of reduction in the backscattering yield of the first beta ray and the percentage of reduction in the backscattering yield of the second beta ray were almost proportional to the deposition quantity of lithium, in samples 1, 3, and 4. This means that the deposition quantity of lithium had been accurately measured. The "deposition quantity" in Table 1 is expressed in terms of the thickness when lithium was not diffused into the substrate (to be precise, the silicon thin film) and deposited on the surface of the substrate in the form of lithium metal.

The percentage of reduction in the backscattering yield of the first beta ray and the percentage of reduction in the backscattering yield of the second beta ray were almost equal in samples 1, 3, and 4 of Table 1. This indicates that the deposited lithium metal was absorbed into the active material layer (silicon thin film) and lithium was almost uniformly distributed in the active material layer.

On the other hand, the percentage of reduction in the backscattering yield of the first beta ray was significantly different from the percentage of reduction in the backscattering yield of the second beta ray in samples 2 and 5. This is a phenomenon seen in the case where lithium metal is unevenly distributed on the surface of the substrate, as described in accordance with the above-mentioned principle. In sample 1, although the deposition quantity was the same as in sample 2, lithium metal was uniformly distributed. From this fact, it can be estimated that the deposited lithium metal had failed to be absorbed into the active material layer due to the low temperature of the substrate, in sample 2. In sample 5, vapor deposition was performed while maintaining the temperature of the substrate to the same temperature as in samples 1, 3, and 4. However, it is presumed that the deposition quantity of lithium in sample 5 was twice that in sample 1, and therefore excessive lithium that had failed to be absorbed into the active material layer remained on the surface of the substrate.

As seen from the measurement results of the charge/discharge efficiency for samples 1, 3, and 4 in Table 2, the deposition quantity of 9 μm in sample 1 that showed about 100% of the charge/discharge efficiency was optimal. In sample 4, excessive lithium was vapor deposited, and thus the produced negative electrode was in a state equivalent to the state where the negative electrode was deeply charged before assembling the battery. A battery produced using such a negative electrode shows seemingly a small initial charge capacity. Accordingly, the charge/discharge efficiency exceeds 100%.

From the above results, it can be seen that measurement and appropriate control of the deposition quantity of lithium and the diffusion state of lithium into the active material layer are important. Further, the control described in the embodiment is enabled by varying the temperature of the substrate during vapor deposition while detecting the backscattering of beta rays emitted from a plurality of beta radiation sources having different nuclides (energy) using a plurality of beta ray detectors.

According to samples 1, 3, and 4, the percentage of reduction in the backscattering yield of the first beta ray is equal to the percentage of reduction in the backscattering yield of the second beta ray. That is, when the vapor deposition conditions in samples 1, 3, or 4 are employed, the deposited lithium is allowed to diffuse into the active material layer without fail. Accordingly, it is possible to know the deposition quantity of lithium even in the case of using only one beta radiation source.

INDUSTRIAL APPLICABILITY

According to the measuring apparatus, the measuring method, and the method for manufacturing an electrode for an electrochemical element (negative electrode for a lithium secondary battery) of the present invention, it is possible to reduce the initial irreversible capacity by allowing a lithium-containing material to deposit on a substrate serving as an electrode and to be absorbed therein, while appropriately controlling the deposition quantity of lithium and the diffusion state of lithium.

The invention claimed is:

1. A method for manufacturing an electrode for an electrochemical element, comprising:
   a deposition step of allowing lithium to deposit on a substrate provided with a layer capable of forming a compound together with lithium;
   a first beta ray irradiation step of emitting a first beta ray using a first beta radiation source and a second beta ray using a second beta radiation source that includes a different type of nuclide from a nuclide of the first beta radiation source, toward the substrate for irradiation before the deposition step;
   a first measurement step of measuring backscattering, from the substrate, of the first beta ray and the second beta ray emitted in the first beta ray irradiation step;
   a second beta ray irradiation step of emitting the first beta ray and the second beta ray toward the substrate for irradiation after the deposition step;
   a second measurement step of measuring backscattering, from the substrate, of the first beta ray and the second beta ray emitted in the second beta ray irradiation step;
   a calculation step of calculating a decrement in backscattering of the first beta ray and a decrement in backscattering of the second beta ray, using results obtained in the first measurement step and results obtained in the second measurement step; and
   a control step of controlling the deposition step depending on the decrement in backscattering of the first beta ray and the decrement in backscattering of the second beta ray.

2. The method for manufacturing an electrode for an electrochemical element according to claim 1, further comprising:
   a conveyance step of conveying the substrate, wherein
   the substrate is an elongated substrate.

3. The method for manufacturing an electrode for an electrochemical element according to claim 2, wherein
   the deposition step is performed while the conveyance step is performed, or
   the conveyance step and the deposition step are performed intermittently.

4. The method for manufacturing an electrode for an electrochemical element according to claim 2, wherein
   the deposition step is performed while the conveyance step is performed so that a deposited portion where lithium is deposited and a non-deposited portion where lithium is not deposited are formed on the elongated substrate,
   the deposited portion is subjected to the second beta ray irradiation step, the second measurement step, and the calculation step, and
   the control step is performed so that the results of the calculation step are fed back to the deposition step for allowing lithium to deposit on the non-deposited portion.

5. The method for manufacturing an electrode for an electrochemical element according to claim 2, wherein
   the conveyance step includes conveying the substrate along a cylindrical can,
   a region for allowing lithium to deposit exists at a position where the substrate extends along the can, and
   the control step includes controlling a temperature of the can.

6. The method for manufacturing an electrode for an electrochemical element according to claim 2, wherein
   the conveyance step includes conveying the substrate along a heating roll,
   the substrate is conveyed along the heating roll after passing through a region for allowing lithium to deposit, and
   the control step includes controlling a temperature of the heating roll.

7. The method for manufacturing an electrode for an electrochemical element according to claim 2, wherein the deposition step includes evaporating lithium from an evaporation source so that lithium is deposited on the substrate, and the control step includes controlling a evaporation rate of the evaporation source.

8. The method for manufacturing an electrode for an electrochemical element according to claim 1, wherein the first beta radiation source includes $^{147}$Pm as a nuclide, and the second beta radiation source includes $^{14}$C as a nuclide.

9. A deposition quantity measuring method comprising:

a deposition step of allowing lithium to deposit on a substrate provided with a layer capable of forming a compound together with lithium;

a first beta ray irradiation step of emitting a first beta ray using a first beta radiation source and a second beta ray using a second beta radiation source that includes a different type of nuclide from a nuclide of the first beta radiation source, toward the substrate for irradiation before the deposition step;

a first measurement step of measuring backscattering, from the substrate, of the first beta ray and the second beta ray emitted in the first beta ray irradiation step;

a second beta ray irradiation step of emitting the first beta ray and the second beta ray toward the substrate for irradiation after the deposition step;

a second measurement step of measuring backscattering, from the substrate, of the first beta ray and the second beta ray emitted in the second beta ray irradiation step; and a calculation step of calculating a decrement in backscattering of the first beta ray and a decrement in backscattering of the second beta ray, using results obtained in the first measurement step and results obtained in the second measurement step.

10. The deposition quantity measuring method according to claim 9, wherein the first beta radiation source includes $^{147}$Pm as a nuclide, and the second beta radiation source includes $^{14}$C as a nuclide.

11. A method for manufacturing an electrode for an electrochemical element, comprising:

a step of preparing a substrate provided with a layer capable of forming a compound together with lithium;

a deposition step of allowing lithium to deposit on the substrate while adjusting a temperature of the substrate to a temperature between a first threshold temperature and a second threshold temperature so as to allow the lithium that has deposited on the substrate to diffuse into the substrate and so as to suppress thermal damage of the substrate;

a first beta ray irradiation step of emitting a beta ray toward the substrate for irradiation before the deposition step;

a first measurement step of measuring backscattering, from the substrate, of the beta ray emitted in the first beta ray irradiation step;

a second beta ray irradiation step of emitting the beta ray toward the substrate for irradiation after the deposition step;

a second measurement step of measuring backscattering, from the substrate, of the beta ray emitted in the second beta ray irradiation step;

a calculation step of calculating a decrement in backscattering of the beta ray using a result obtained in the first measurement step and a result obtained in the second measurement step; and a control step of controlling the deposition step depending on the decrement in backscattering of the beta ray.

12. The method for manufacturing an electrode for an electrochemical element according to claim 11, wherein the substrate is made of copper or copper alloy, and the first threshold temperature is 250° C. and the second threshold temperature is 400° C.

13. The method for manufacturing an electrode for an electrochemical element according to claim 11, wherein the control step includes controlling a deposition rate of lithium onto the substrate.

* * * * *